(12) United States Patent
Gates et al.

(10) Patent No.: US 9,786,550 B2
(45) Date of Patent: Oct. 10, 2017

(54) LOW RESISTANCE METAL CONTACTS TO INTERCONNECTS

(71) Applicant: International Business Machines Corporation, Armonk, NY (US)

(72) Inventors: Stephen M. Gates, Ossining, NY (US); Gregory M. Fritz, Wakefield, MA (US); Eric A. Joseph, White Plains, NY (US); Terry A. Spooner, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/749,811

(22) Filed: Jun. 25, 2015

(65) Prior Publication Data

US 2016/0379869 A1     Dec. 29, 2016

(51) Int. Cl.

| H01L 21/76 | (2006.01) |
| H01L 21/768 | (2006.01) |
| H01L 23/522 | (2006.01) |
| H01L 23/532 | (2006.01) |
| H01L 23/528 | (2006.01) |

(52) U.S. Cl.
CPC .. H01L 21/76814 (2013.01); H01L 21/76802 (2013.01); H01L 21/76877 (2013.01); H01L 21/76883 (2013.01); H01L 21/76888 (2013.01); H01L 23/528 (2013.01); H01L 23/5226 (2013.01); H01L 23/53209 (2013.01)

(58) Field of Classification Search
CPC ......... H01L 21/76814; H01L 21/76877; H01L 21/76888; H01L 23/5226; H01L 23/528; H01L 23/53209
See application file for complete search history.

(56) References Cited

U.S. PATENT DOCUMENTS

| 7,180,193 B2 | 2/2007 | Liu et al. |
| 7,528,066 B2 | 5/2009 | Yang et al. |
| 7,732,922 B2 | 6/2010 | Yang et al. |
| 7,843,063 B2 | 11/2010 | Baker-O'Neal et al. |
| 8,021,974 B2 | 9/2011 | Yang et al. |
| 8,232,647 B2 | 7/2012 | Yang et al. |
| 9,142,505 B2 * | 9/2015 | Yang ................... H01L 23/5226 |

(Continued)

OTHER PUBLICATIONS

Anik et al., "Effect of pH on the Anodic Behavior of Tungsten", Journal of the Electrochemical Society, vol. 149, No. 6, 2002, pp. B224-B233.

(Continued)

*Primary Examiner* — Fernando L Toledo
*Assistant Examiner* — Neil Prasad
(74) *Attorney, Agent, or Firm* — Cantor Colburn LLP; Vazken Alexanian

(57) ABSTRACT

A semiconductor device and a method of fabricating a contact to interface with an interconnect in a semiconductor device are described. The device includes a dielectric layer formed on a semiconductor layer, and a contact fabricated in a via formed within the dielectric layer. An interconnect formed above the contact interfaces with an exposed surface of the contact opposite a surface closest to the semiconductor layer. The contact includes a contact material in a first portion of the contact and an interface metal in a second portion of the contact.

11 Claims, 19 Drawing Sheets

(56) References Cited

U.S. PATENT DOCUMENTS

| | | | |
|---|---|---|---|
| 2002/0121699 A1 | 9/2002 | Cheng et al. | |
| 2006/0170020 A1* | 8/2006 | Ohta | H01L 21/76834 257/295 |
| 2008/0076230 A1* | 3/2008 | Cheng | H01L 29/66181 438/386 |
| 2008/0311718 A1* | 12/2008 | Futase | C23C 16/0281 438/296 |
| 2009/0075472 A1* | 3/2009 | Arnold | H01L 21/02063 438/623 |
| 2009/0302473 A1* | 12/2009 | Shibata | H01L 21/7682 257/751 |
| 2010/0081272 A1* | 4/2010 | Jang | H01L 21/76804 438/637 |
| 2013/0320544 A1* | 12/2013 | Lin | H01L 23/53238 257/758 |
| 2014/0183738 A1 | 7/2014 | Jezewski et al. | |
| 2014/0327140 A1* | 11/2014 | Zhang | H01L 21/76843 257/751 |
| 2015/0318243 A1* | 11/2015 | Lin | H01L 21/28518 257/751 |

OTHER PUBLICATIONS

Yang et al., "Effects of Contact Area on Mechanical Strength, Electrical Resistance, and Electromigration Reliability of Cu/Low-k Interconnects", Electrochemical and Solid-State Letters, vol. 13, No. 6, 2010, pp. H197-H199.
List of IBM Patents or Patent Applications Treated as Related; (Appendix P), Filed Jan. 7, 2016; 2 pages.
Stephen M. Gates et al., "Low Resistance Metal Contacts to Interconnects", U.S. Appl. No. 14/949,386, filed Nov. 23, 2015.

* cited by examiner

LOW RESISTANCE METAL CONTACTS TO INTERCONNECTS

BACKGROUND

The present invention relates to contacts in semiconductor devices, and more specifically, to low resistance metal contacts to interconnects.

In semiconductor devices, a contact acts as a bridge between the semiconductor (e.g., silicon (Si)) and a low-resistance metal interconnect (e.g., copper (Cu)). The contact material is typically disposed in an opening (via) in a dielectric layer and is needed as a buffer because the metal interconnect is typically a material that reacts with the semiconductor. For example, Cu dissolves in Si such that a Cu interconnect requires a contact (e.g., tungsten (W)) between the Cu and the Si. As semiconductor devices are made smaller, the contacts are also smaller. Because less area results in more resistance, the smaller contacts have higher resistance.

SUMMARY

According to one embodiment, a semiconductor device includes a dielectric layer formed on a semiconductor layer; a contact fabricated in a via formed within the dielectric layer; and an interconnect formed above the contact and interfacing with an exposed surface of the contact, wherein the contact includes a contact material in a first portion of the contact and a metal in a second portion of the contact, and at least a part of the second portion is at the exposed surface.

According to another embodiment of the present invention, a method of fabricating a contact to interface with an interconnect in a semiconductor device includes forming a via in a dielectric layer formed above a semiconductor layer; filling a first portion of the via with a contact material; and filling a second portion of the via with a metal, wherein the contact includes the first portion and the second portion, and an exposed surface of the contact interfaces with the interconnect.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 2-5 are cross-sectional views illustrating the formation of a contact according to an embodiment of the invention, in which:

FIG. 2 illustrates a via formed in a dielectric layer;

FIG. 3 shows the result of a W fill in the via shown in FIG. 2;

FIG. 4 shows the slit opening resulting from a CMP process on the structure shown in FIG. 3;

FIG. 5 shows the result of a metal fill in the slit opening shown in FIG. 4.

FIG. 7-9 are cross sectional views illustrating the formation of a contact according to another embodiment of the invention, in which:

FIG. 7 shows W conformally lining a via;

FIG. 8 shows the result of a metal fill within the W lining; and

FIG. 9 shows the structure resulting from a CMP process on the structure shown in FIG. 8;

FIGS. 10-13 are cross sectional views illustrating the formation of a contact according to yet another embodiment of the invention, in which:

FIG. 10 shows a W fill in a via with a seam formed in the W fill;

FIG. 11 shows an enlargement of the seam;

FIG. 12 shows the result of creating an opening within the seam; and

FIG. 13 shows the structure resulting from metal fill of the opening followed by a CMP process;

FIGS. 14-18 are cross sectional views illustrating the formation of a contact according to yet another embodiment of the invention, in which:

FIG. 14 shows a W fill in a via formed in a dielectric;

FIG. 15 shows the result of performing a CMP process;

FIG. 16 results from oxidation of some of the W fill;

FIG. 17 shows the structure resulting from metal fill of the portions where W was oxidized as shown in FIG. 16; and FIG. 18 shows the result of a CMP process on the structure of FIG. 17.

DETAILED DESCRIPTION

As noted above, contacts are required as a buffer between a semiconductor such as Si and a metal interconnect such as Cu, but smaller contacts result in higher resistance. Because a given semiconductor device may have a number of contacts on the order of millions, the increased resistance of these smaller contacts can limit the performance of the semiconductor chip. Embodiments of the systems and methods detailed herein relate to reducing contact resistance by including an interface metal in addition to a contact material (e.g., tungsten (W)) in the contact. Several different embodiments are discussed but each reduces resistance without increasing the diameter of the via in which the contact is formed. The different embodiments all include the contact comprising both the material and an interface metal. Each embodiment may be seen as a different tradeoff between reducing contact material to interconnect material interface area (by replacement with interface metal to interconnect material interface area) and increasing surface area of contact material to interface metal interaction within the contact.

Figure 1:
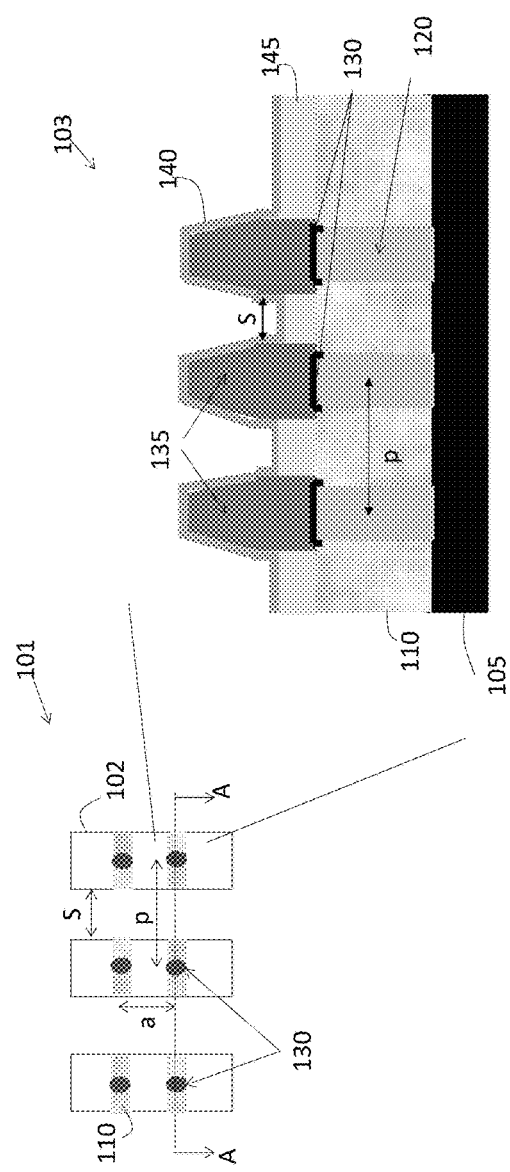
FIG. 1 illustrates top and side cross sectional views of a semiconductor device according to an embodiment of the invention.

FIG. 1 illustrates top and side cross sectional views of a semiconductor device according to an embodiment of the invention. The cross sectional top view 101 shows six of the contacts (120/130) and, specifically, the interface metal 130 of the semiconductor device. A pitch a may define the distance between adjacent contacts 120 along one axis and a pitch p may define the distance between adjacent contacts 120 along another (perpendicular) axis. The two pitches (a and p) may be equal or a may be less than p, as shown in FIG. 1, for example. Distance between the wires 102 may be S. An exemplary targeted technology may be a 7 nanometer (nm) node, meaning that the minimum dimension (targeted gate size) that is printed lithographically is 7 nm. In a 7 nm node, a pitch between contacts (e.g., a, p, or both) may be 44 nm and each contact may be 18 nm in diameter. The wire 102 width may be 22 nm, and the distance S between wires 102 may also be 22 nm. In alternate embodiments, the pitches (a and p) may be on the order of 66 nm, S may be on the order of 40 nm, and width of the wire may be on the order of 26 nm. While exemplary values are provided for explanatory purposes, embodiments detailed herein contemplate other values for the wire 102 width, distance S, and pitches (a and p). The cross-sectional view along A-A 103 details the contact (120/130) to interconnect 135 interface according to the embodiment. According to the present embodiment, the contact material or W 120 fill is in vias (115 (FIG. 2) formed in a dielectric layer 110 above a semiconductor layer 105. The semiconductor layer 105 may be Si, carbon (C), or gallium arsenide (GaAs) or a different III-V semiconductor layer, or an alloy of Si such as silicon germanium (SiGe), or SiC with a transistor fabricated therein. The contact (120/130) is formed with the dielectric layer 110, as detailed below, and includes the W 120 fill and the interface metal 130 fill. In the embodiment shown in FIG. 1, the interface metal 130 fill forms the entire contact-to-interconnect interface in this embodiment. That is, W 120 fill does not directly interface with the interconnect 135 according to the embodiment shown in FIG. 1. Instead, the interface metal 130 fill acts as a cap on the W 120 fill and forms the interface with the interconnect 135. The interface metal fill 130 may comprise cobalt (Co) and the interconnect 135 may comprise Cu, for example. In alternate embodiments, the interface metal 130 may be nickel (Ni), palladium (Pd), platinum (Pt), or ruthenium (Ru). A low-k dielectric layer 145 is formed above the dielectric layer 110, and a nitride cap 140 is conformally formed over the interconnects 135. The copper may be additively patterned in a known damascene process or may be subtractively patterned. That is, the lowest level (M1) line may be subtractively patterned such that the interconnect 135 (e.g., Cu) is blanket deposited and then lithographically etched.

Figure 2:
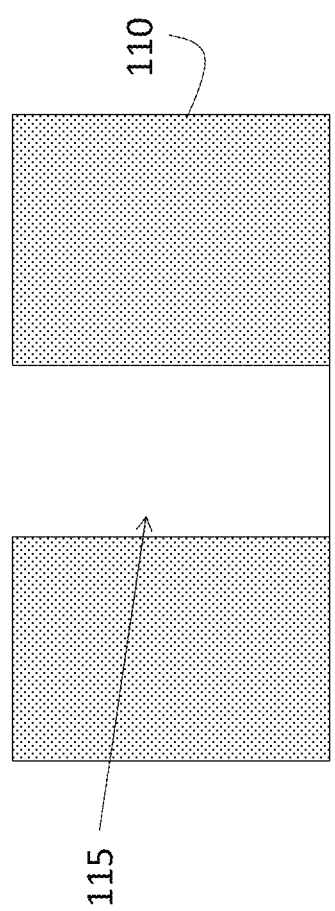
Figure 3:
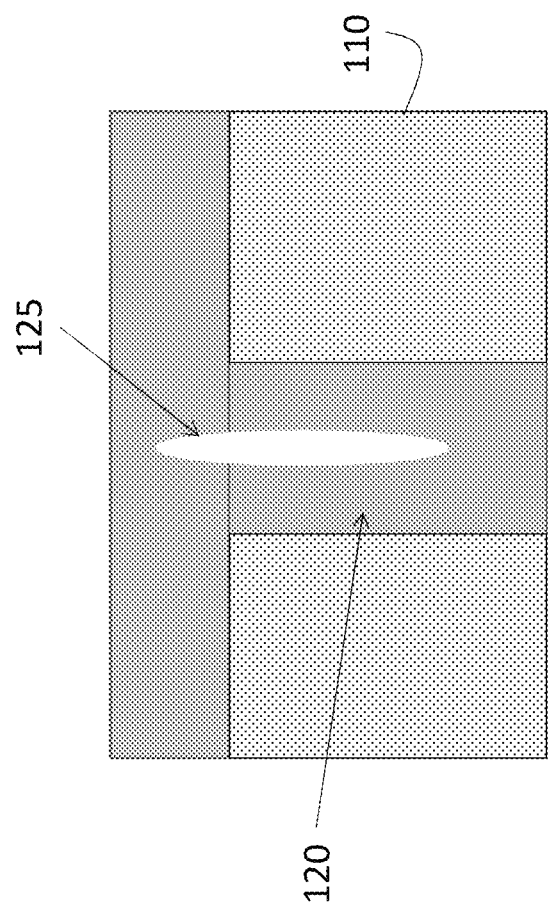
Figure 4:
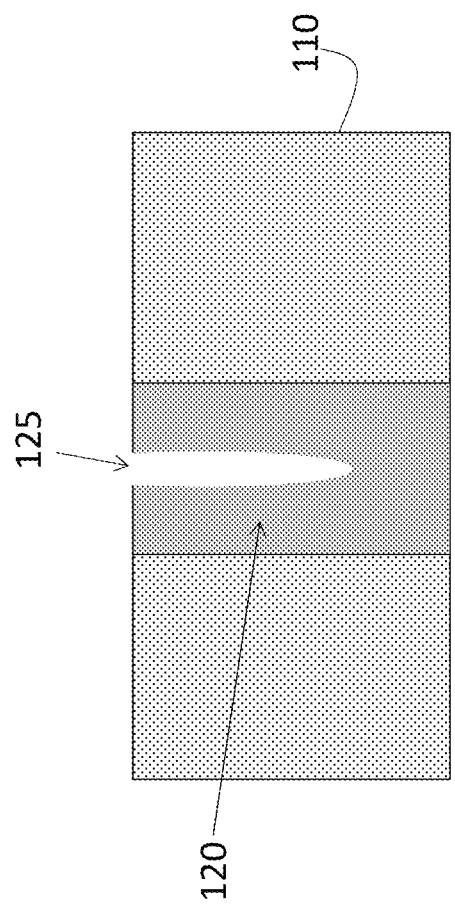
Figure 5:
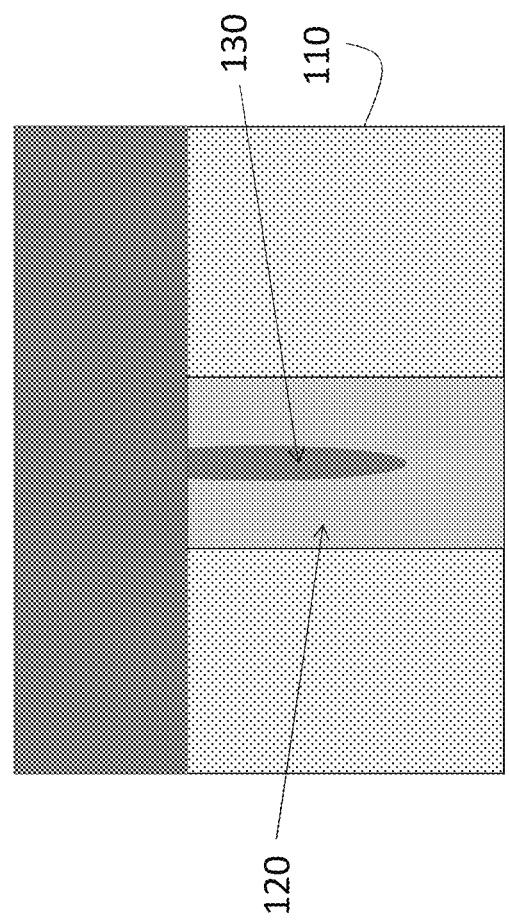
Figure 6:
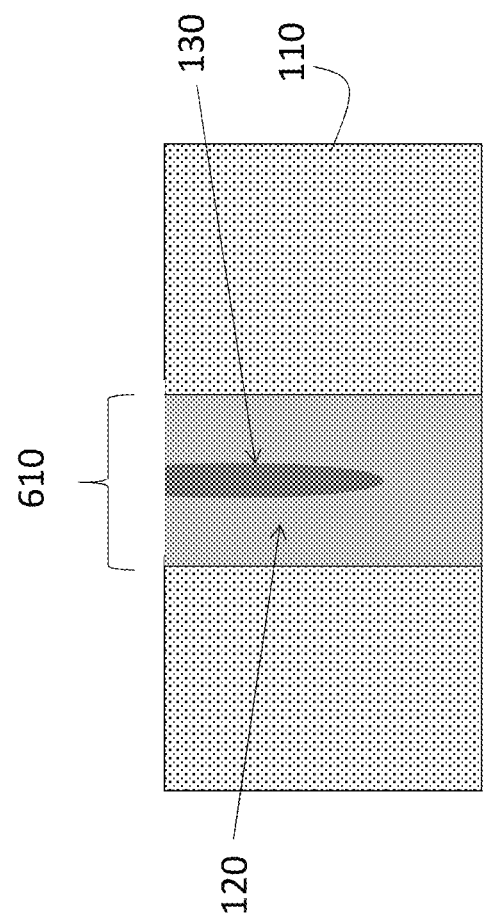
FIG. 6 shows the contact resulting from another CMP process.

FIGS. 2-6 are cross-sectional views illustrating the formation of a contact (120/130) according to an embodiment of the invention. FIG. 2 shows a via 115 or hole formed in a dielectric layer 110. The dielectric layer 110 may be silicon dioxide ($SiO_2$), for example, and is formed above the semiconductor device. The material that ultimately fills this via 115 forms the contact (120, 130). A non-conformal W 120 fill in the via 115 results in the structure shown in FIG. 3. A non-conformal fast deposition is used to form the keyhole-shaped slit 125 within the W 120 fill. By performing a chemical mechanical planarization (CMP) process on the structure shown in FIG. 3, the slit 125 is opened at the top as shown in FIG. 4. A wet clean process may be performed to remove W oxides from the slit 125 opening. While a slit 125 is specifically shown and discussed for explanatory purposes, the opening may be of another shape, as well. The structure shown in FIG. 5 results from an interface metal 130 fill. This interface metal 130 may be Co, Ni, Pd, Pt, or Ru for example, and another CMP process results in the structure shown in FIG. 6. As FIG. 6 shows, the top surface of the via 115 in the dielectric layer 110 includes W 120 but also the metal 130. That is, the contact surface or interface 610 to the interconnect 135 includes W 120 and metal 130. As noted above, the interconnect 135 may comprise Cu. For the same given via 115 diameter, the W 120 to interconnect 135 interface area is reduced and is replaced with lower resistance interface metal 130 to interconnect 135 interface according to the embodiment shown in FIGS. 2-6.

Figure 7:
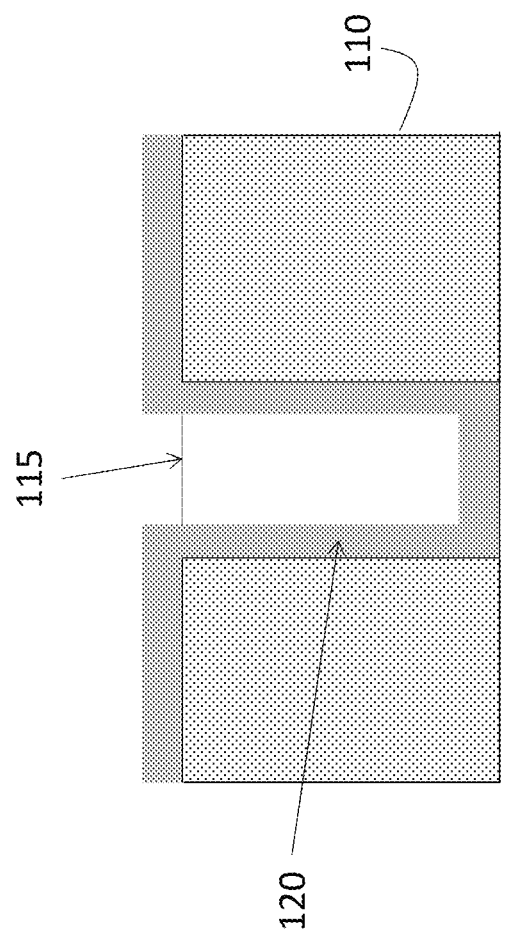
Figure 8:
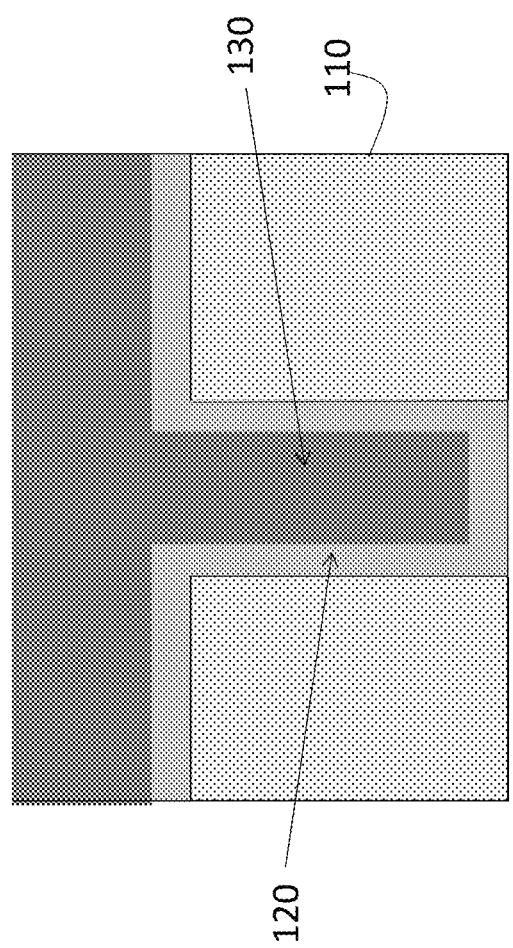
Figure 9:
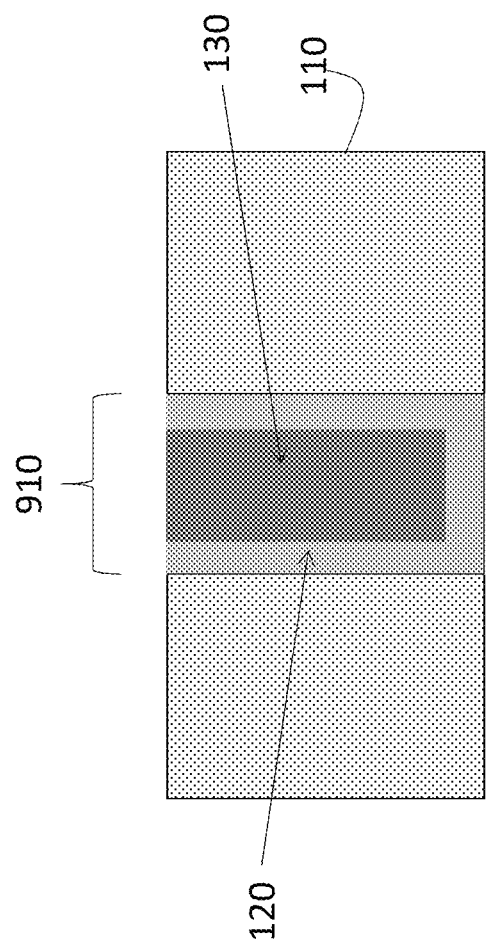

FIGS. 7-9 are cross sectional views illustrating the formation of a contact according to another embodiment of the invention. FIG. 7 shows the W 120 conformally lining the via 115. The W 120 may be deposited using atomic layer deposition (ALD), for example. Depositing an interface metal 130 to completely fill the via 115 results in the structure shown in FIG. 8. Again, the interface metal 130 may be Co, Ni, Pd, Pt, or Ru for example. Polishing the W 120 and interface metal 130 (e.g., by one or more CMP processes) results in the structure shown in FIG. 9. The contact surface or interface 910 includes mostly interface metal 130 but also W 120. A comparison of FIG. 6 with FIG. 9 (a comparison of 610 with 910) indicates that even more of the interface between the interconnect 135 and the via 115 surface will be with the interface metal 130 than with the W 120 in the embodiment illustrated in FIG. 9 than in the embodiment illustrated in FIG. 6. Additionally, the surface area of interaction between the W 120 and interface metal 130 within the contact (120/130) is larger in the embodiment illustrated in FIG. 9 than in the embodiment illustrated in FIG. 6. Accordingly, the resistance resulting from the embodiment shown in FIG. 9 is even lower than the resistance resulting from the embodiment shown in FIG. 6. The W 120 liner acts as a buffer between the dielectric layer 110 and semiconductor layer below and the interface metal 130, which is lower in resistance than the W 120.

Figure 10:
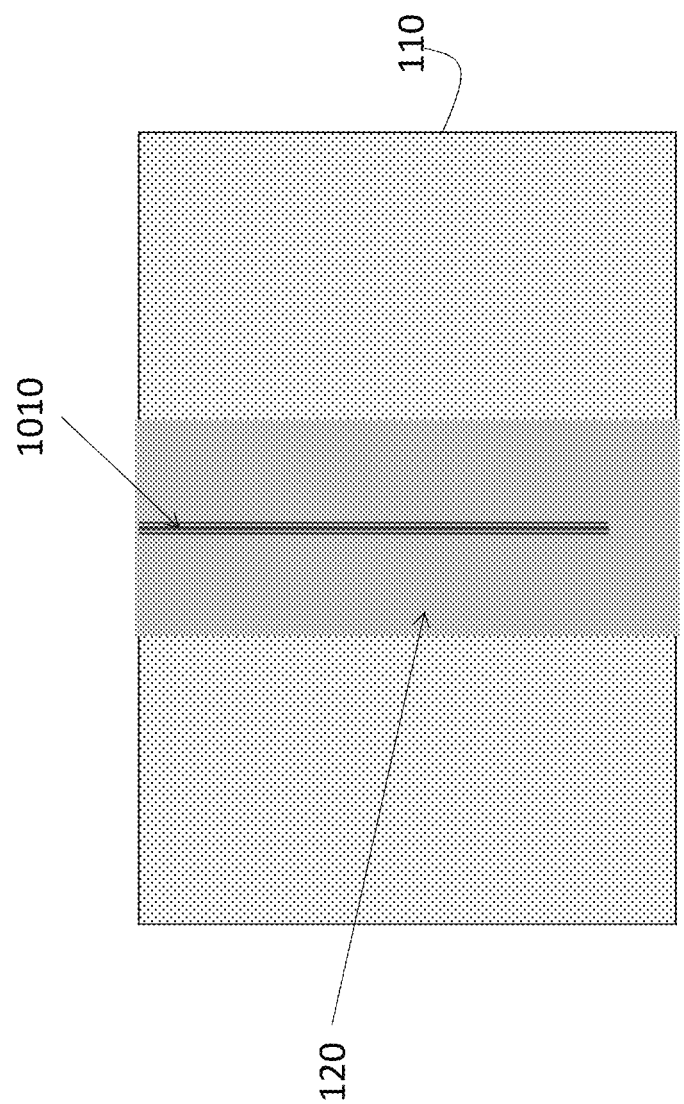
Figure 11:
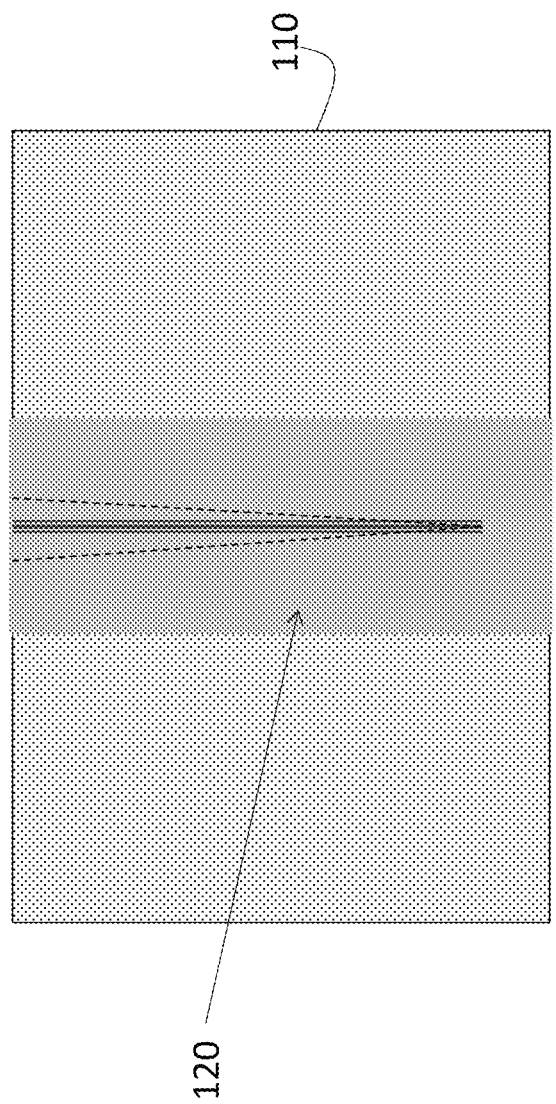
Figure 12:
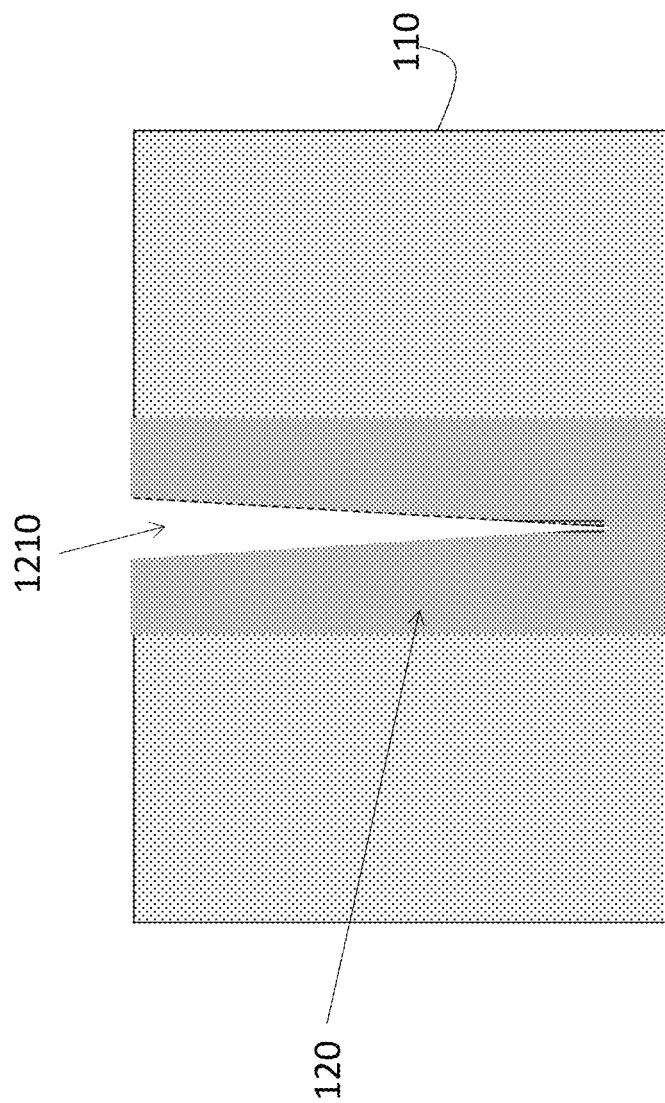
Figure 13:
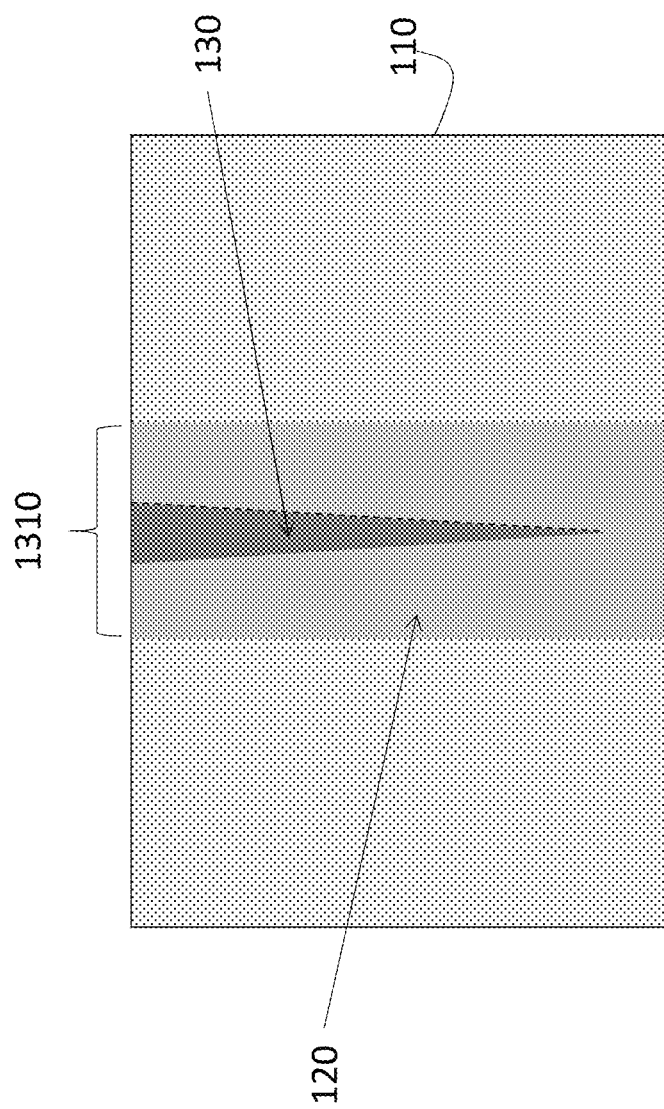

FIGS. 10-13 are cross sectional views illustrating the formation of a contact according to yet another embodiment of the invention. FIG. 10 shows a W 120 fill in the via 115 formed within a dielectric layer 110. A CMP process is performed on the W 120 fill to form a seam 1010 or narrow void in the W 120 fill. This seam 1010 is enlarged as shown in FIG. 11. The enlargement may be achieved through oxidation of the W 120 at 500 to 600 degrees Celsius, for example, in an oxygen or nitrous oxide ($N_2O$) plasma environment. Creating an opening 1210 in the enlarged seam 1010 results in the structure shown in FIG. 12. The opening 1210 may be formed by dissolving tungsten (III) oxide ($W_2O_3$) or tungsten trioxide ($WO_3$) in a high pH solution. In alternate embodiments to those shown in FIG. 12, the shape and depth of the opening 1210 may be different than shown in FIG. 12. A interface metal 130 fill in the opening 1210 followed by a CMP process results in the structure shown in FIG. 13. The interface metal 130 may be Co, Ni, Pd, Pt, or Ru for example. The interface metal 130 fill may be preceded by a wet clean process to clean out W oxide from the opening 1210. The contact surface or interface 1310 with the interconnect 135 indicates that the amount of interface metal 130 replacing W 120 is more similar to that of interface 610 than that of interface 910. However, in comparison to the embodiment shown in FIG. 6, the interaction between W 120 and the interface metal 130 within the contact (120/130) is over a larger surface area in the embodiment shown in FIG. 13. Thus, as a comparison of FIGS. 6 and 9 with FIG. 13 indicates, the resulting decrease in resistance due to the interface metal 130 replacing some of the W 120 at the interface 1310 with the interconnect 135 is likely to be more than that of the embodiment shown in FIG. 6 (interface 610) and less than that of the embodiment shown in FIG. 9 (interface 910).

Figure 14:
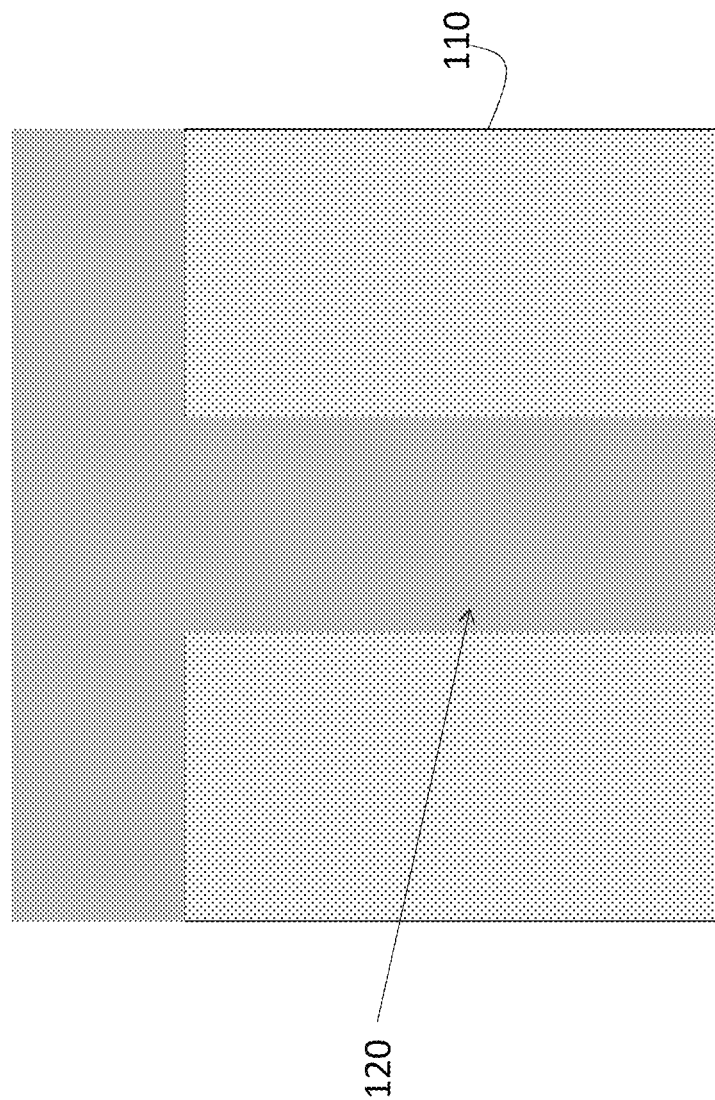
Figure 15:
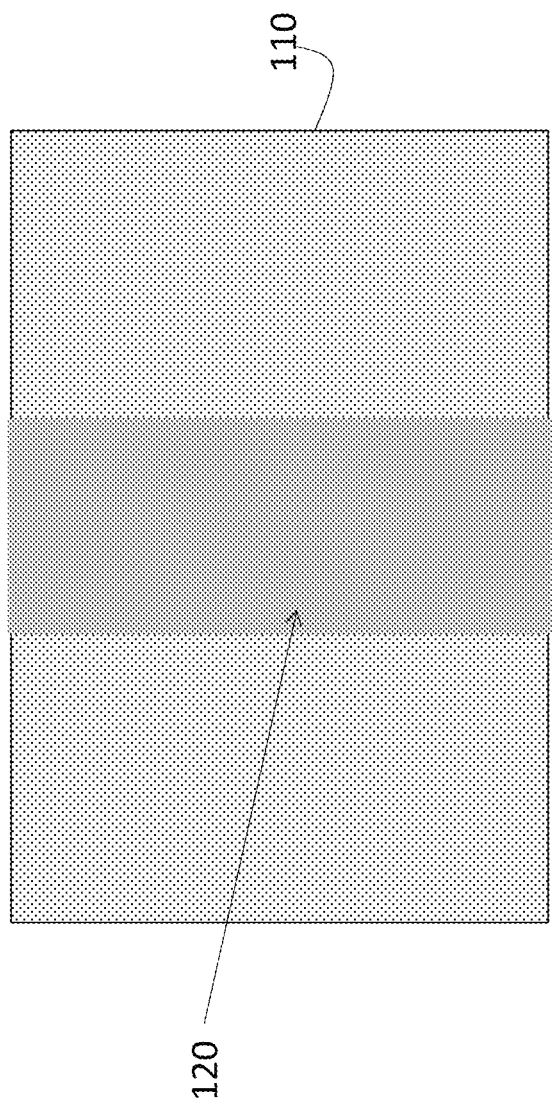
Figure 16:
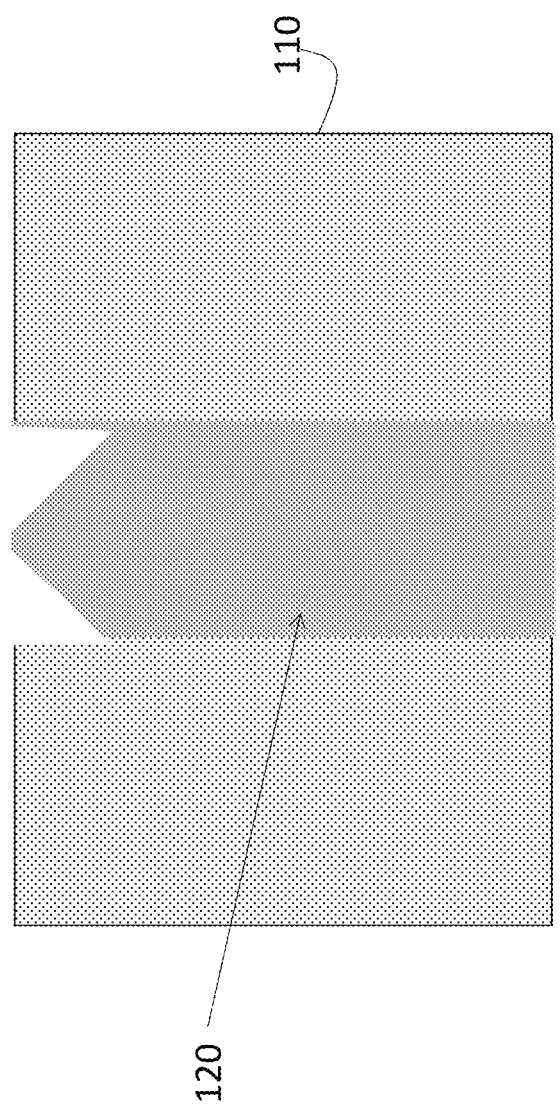
Figure 17:
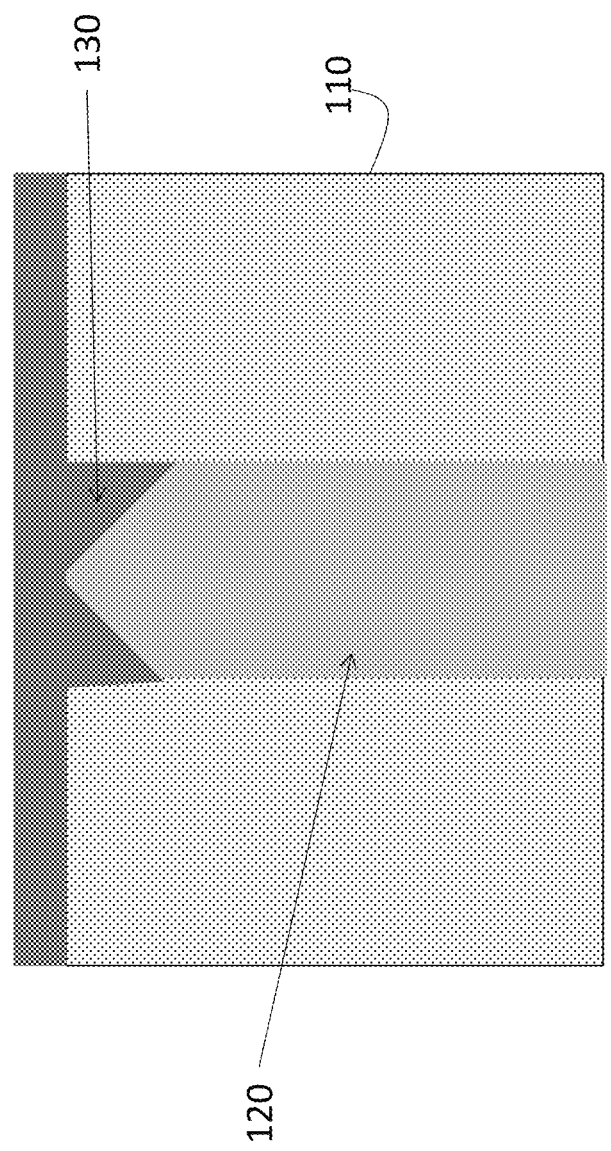
Figure 18:
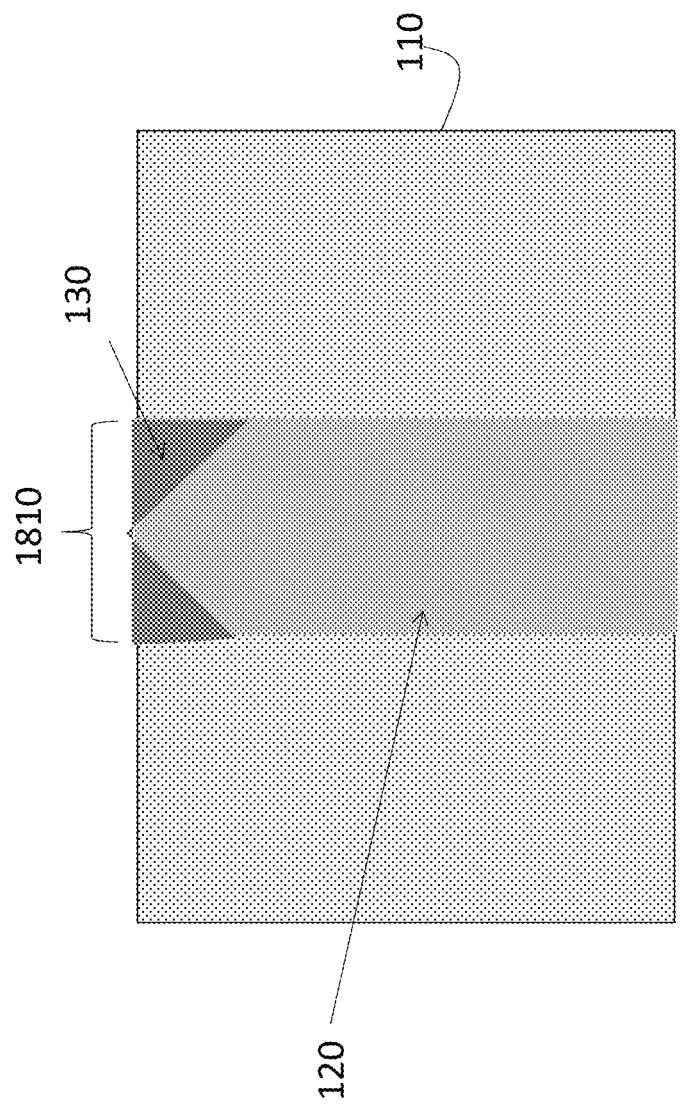

FIGS. 14-18 are cross sectional views illustrating the formation of a contact according to yet another embodiment of the invention. FIG. 14 shows a W 120 fill of a via 115 formed in a dielectric layer 110, and a CMP process on the structure shown in FIG. 14 results in a standard contact as shown in FIG. 15. Typically, an interconnect 135 would then be formed on this W 120 contact. According to the current embodiment, W 120 at the interface with where the interconnect 135 would be formed (around the perimeter of the via 115) is oxidized to result in the structure shown in FIG. 16. As FIG. 16 indicates, the W 120 is recessed to have an inverted-v shape such that more W 120 is recessed along the outer portions of the via 115. The exposed W 120 has a larger surface area than the (flat) W 120 prior to oxidation. The oxidation may be performed under gas cluster ion beam (GCIB) exposure of the reactant gas (oxidizer), for example. A wet clean process may then be performed to selectively remove oxidized W 120. An interface metal 130 fill results in the structure shown in FIG. 17. As shown, the portions of the via 115 in which oxidized W 120 is removed are now filled with interface metal 130. A further CMP process results in the structure shown in FIG. 18. As a result of the oxidation and interface metal 130 fill, the contact surface or interface 1810 with an interconnect 135 comprises only interface metal 130 and substantially no W 120 such that the interconnect 135 formed above the dielectric layer 110 would interface only with the interface metal 130. Additionally, based on the inverted-v shape of the recessed W 120, more surface area interaction between W 120 and the interface metal 130 within the contact (120/130) is facilitated as compared to a uniform recess of the W 120 across the diameter of the via 115. The combination of these two factors results in decreased resistance of the contact (120/130) shown in FIG. 18 (as compared with that in FIG. 15).

Figure 19:
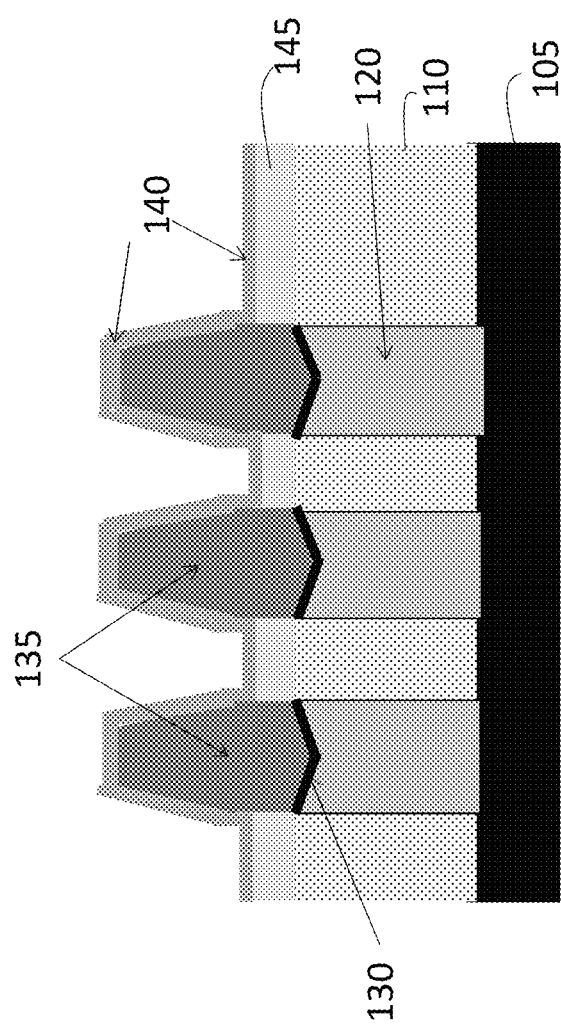
FIG. 19 shows a cross sectional view of a portion of a semiconductor device according to an embodiment of the invention.

FIG. 19 shows a cross sectional view of a portion of a semiconductor device according to an embodiment of the invention. Like FIG. 1, FIG. 19 illustrates cross sectional views of three contacts (120/130). The contacts (120/130) are formed in vias (115) of a dielectric layer 110 formed over a semiconductor layer 105. The W 120 portion of the contacts (120/130) is recessed in a v shape (rather than in an inverted-v shape, as in the embodiment of FIG. 18). The recessed portion is filled with interface metal 130. Like the inverted-v shaped recess of the embodiment shown in FIG. 18 (and in contrast with the uniform recess of W 120 shown in FIG. 1), the v-shaped recess of W 120 results in a larger surface area for interaction between the W 120 and the interface metal 130 filled in the recessed portion. The interconnects 135 formed above the contacts (120/130) interface only with the interface metal 130 (rather than with any W 120), like the embodiments shown in FIGS. 1 and 18. A nitride cap 140 is formed conformally on the interconnects 135, and a low-k dielectric 145 is formed on the dielectric layer 110.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device, comprising:
a dielectric layer formed on a semiconductor layer;
a contact fabricated in a via formed within the dielectric layer; and
an interconnect formed entirely above the contact to interface with an exposed surface of the contact opposite a surface closest to the semiconductor layer, wherein the contact includes a contact material in a first portion of the contact and an interface metal in a second portion of the contact, the first portion is greater than the second portion, and the interface metal includes one or more of: cobalt, nickel, palladium, platinum, and ruthenium, wherein the via comprises only the contact material and the interface metal.

2. The device according to claim 1, wherein the exposed surface of the contact includes both the first portion of the contact and the second portion of the contact.

3. The device according to claim 1, wherein the exposed surface of the contact includes only the second portion of the contact which includes the interface metal.

4. The device according to claim 1, wherein the contact material includes tungsten.

5. The device according to claim 1, wherein the second portion of the contact which includes the interface metal forms an opening within the first portion which includes the contact material.

6. The device according to claim 1, wherein the first portion forms a lining on a wall of the via and on a surface of the dielectric layer opposite the exposed surface.

7. The device according to claim 1, wherein the second portion is in a seam within the first portion.

8. The device according to claim 1, wherein the second portion is formed as a cap over the first portion.

9. The device according to claim 1, wherein two or more of the contacts fabricated in respective vias are adjacent and are about 20 to 70 nanometers apart from center-to-center.

10. The device according to claim 1, further comprising a low-k dielectric layer formed above the dielectric layer in which the contacts are formed.

11. The device according to claim 1, further comprising a nitride cap conformally formed over the interconnect.

* * * * *